United States Patent
Tanaka

(10) Patent No.: US 10,522,228 B2
(45) Date of Patent: Dec. 31, 2019

(54) STORAGE DEVICE

(71) Applicant: TOSHIBA MEMORY CORPORATION, Tokyo (JP)

(72) Inventor: Hiroyasu Tanaka, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,411

(22) Filed: Mar. 2, 2018

(65) Prior Publication Data
US 2018/0268902 A1 Sep. 20, 2018

(30) Foreign Application Priority Data
Mar. 17, 2017 (JP) ................. P2017-053488

(51) Int. Cl.
| | |
|---|---|
| G11C 16/04 | (2006.01) |
| H01L 27/11565 | (2017.01) |
| H01L 27/11582 | (2017.01) |
| H01L 27/1157 | (2017.01) |
| H01L 27/11573 | (2017.01) |
| H01L 27/11575 | (2017.01) |
| G11C 19/28 | (2006.01) |

(52) U.S. Cl.
CPC .......... *G11C 16/0466* (2013.01); *G11C 19/28* (2013.01); *H01L 27/1157* (2013.01); *H01L 27/11565* (2013.01); *H01L 27/11573* (2013.01); *H01L 27/11575* (2013.01); *H01L 27/11582* (2013.01)

(58) Field of Classification Search
CPC .......... H01L 27/1157; H01L 27/11573; H01L 27/11575; H01L 27/1158
See application file for complete search history.

(56) References Cited

U.S. PATENT DOCUMENTS

| | | | |
|---|---|---|---|
| 7,800,163 B2 | 9/2010 | Izumi et al. | |
| 9,431,415 B2* | 8/2016 | Shin | H01L 27/11578 |
| 9,953,992 B1* | 4/2018 | Ogawa | H01L 27/11556 |
| 9,985,048 B2* | 5/2018 | Lee | H01L 27/0688 |
| 10,115,632 B1* | 10/2018 | Masamori | H01L 21/76877 |
| 10,249,640 B2* | 4/2019 | Yu | H01L 23/5226 |
| 10,256,248 B2* | 4/2019 | Lu | H01L 21/4846 |

FOREIGN PATENT DOCUMENTS

JP 2009094236 A 4/2009

* cited by examiner

*Primary Examiner* — Allison Bernstein
(74) *Attorney, Agent, or Firm* — Kim & Stewart LLP

(57) ABSTRACT

A storage device includes a circuit on a substrate, electrode layers stacked on the circuit, a channel layer penetrating the electrode layers in a stacking direction, a plate-shaped first wire between the electrode layers and the circuit and electrically connected to the channel layer, a second wire at a level between the circuit and the first wire, a third wire between the circuit and the second wire, a contact plug penetrating the electrode layers and the first wire in the stacking direction and electrically connected to the second wire, and a columnar support body penetrating the electrode layers and the first wire in the stacking direction. The columnar support body has a lower end in contact with the second wire or the third wire. The first wire has a through-via-hole above the second wire, and the contact plug and the columnar support body are disposed inside the through-via-hole.

19 Claims, 5 Drawing Sheets

STORAGE DEVICE

CROSS-REFERENCE TO RELATED APPLICATION

This application is based upon and claims the benefit of priority from Japanese Patent Application No. 2017-053488, filed Mar. 17, 2017, the entire contents of which are incorporated herein by reference.

FIELD

An embodiment described herein relates generally to a storage device.

BACKGROUND

A storage device with a large storage capacity with three-dimensionally stacked memory cells can be provided with a circuit for driving the memory cells between the memory cells and a substrate. In the storage device having such a configuration, a circuit design configurations can be simplified, and the operation speed can be improved, by providing a contact plug that penetrates through a region where the memory cells are located to connect to the driving circuit. However, to provide such a structure, the memory cell region would have to be adapted to permit inclusion of the contact plug.

DETAILED DESCRIPTION

Figure 1:
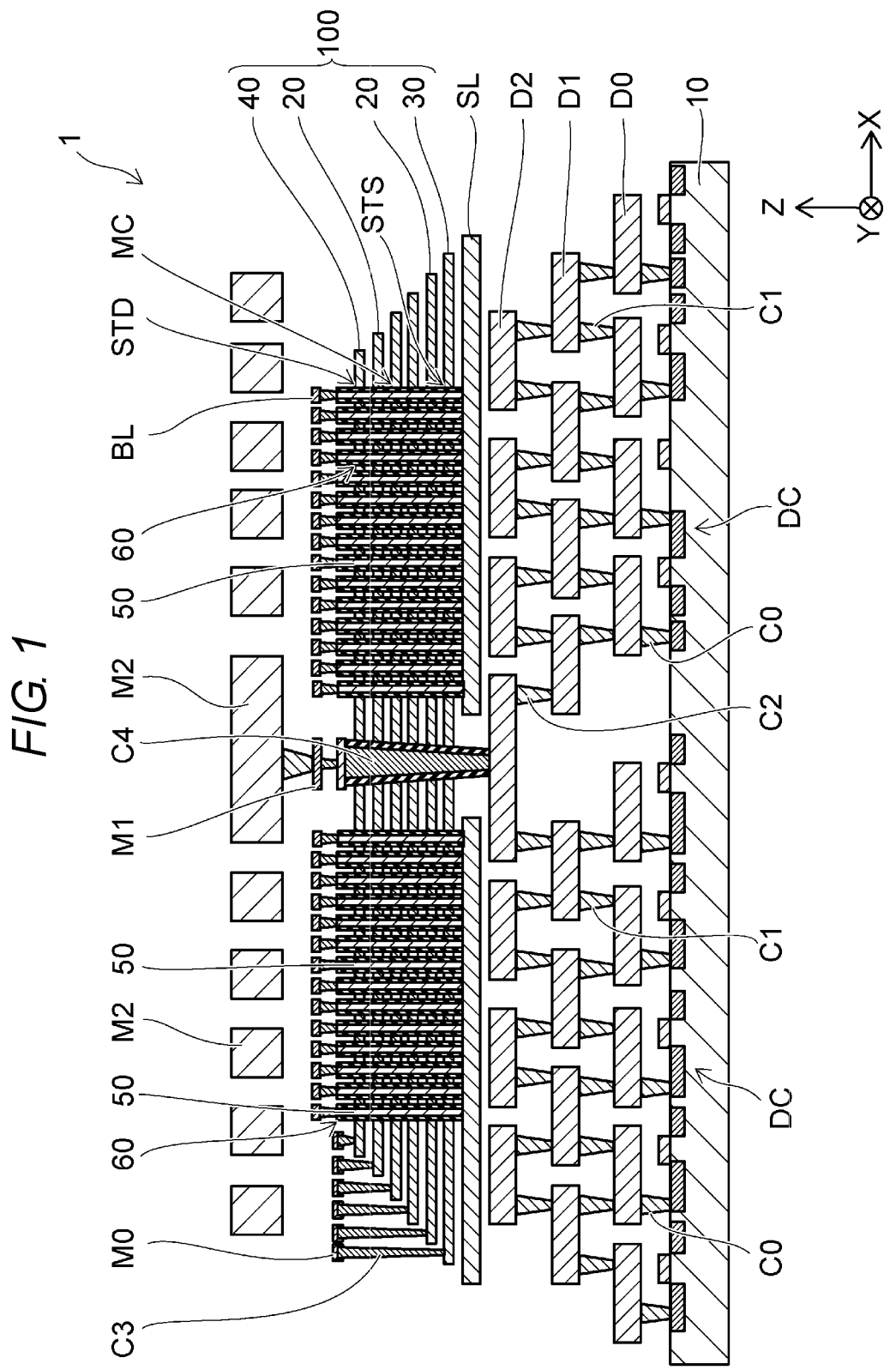
FIG. 1 is a schematic cross-sectional view showing a storage device according to an embodiment.

In general, according to an embodiment, a storage device includes a circuit on a substrate, electrode layers stacked on the circuit in a stacking direction, a channel layer penetrating the electrode layers in the stacking direction, a first wire having a planar shape between the electrode layers and the circuit, and electrically connected to the channel layer, a second wire at a level between the circuit and the first wire, a third wire between the circuit and the second wire, and a contact plug penetrating the electrode layers and the first wire in the stacking direction. The contact plug electrically connects to the second wire, and a columnar support body penetrates the electrode layers and the first wire in the stacking direction, and has a lower end in contact with one of the second wire or the third wire. The first wire has a through-via-hole above the second wire, and the contact plug and the columnar support body are inside the through-via-hole.

Example embodiments will be described below with reference to the accompanying drawings. The same reference numerals are assigned to the same aspects depicted in the different drawings and detailed description of repeated aspects may be omitted as appropriate so different aspects can be described. It is noted that the drawings are schematic or conceptual, and relationship between the thickness and width of each portion, and the size ratio between portions do not always reflect the actual dimensions in a real device. Further, even if the same portions are shown, respective dimensions and ratios may be differently depicted in some drawings.

Further, the placement and configuration of each portion will be described using an X-axis, a Y-axis and a Z-axis shown in each drawing. The X-axis, Y-axis and Z-axis are mutually orthogonal, and represent the X direction, Y direction and Z direction, respectively. Furthermore, one direction along the Z axis may be described as an upward direction, and an opposite direction as a downward direction.

FIG. 1 is a schematic cross-sectional view showing a storage device 1. The storage device 1 is, for example, a NAND-type, nonvolatile storage device, and includes memory cells MC three-dimensionally arranged. An insulating layer that electrically insulates each component of the storage device 1 is not specifically shown in FIG. 1.

As shown in FIG. 1, the storage device 1 includes a substrate 10, and wires D0, D1 and D2. The substrate 10 is, for example, a silicon substrate, and a drive circuit DC for memory cell MC is provided on the upper surface thereof. The wires D0, D1 and D2 are sequentially stacked on the substrate 10 and electrically connect a circuit element such as a transistor, for example. The wire D0 is connected to a circuit element on the substrate 10 via a contact plug C0, for example. The wire D1 is connected to the wire D0 via a contact plug C1, for example. Further, the wire D2 is connected to the wire D1 via a contact plug C2, for example.

The storage device 1 further includes a source line SL, word lines 20, selection gates 30 and 40, and a channel layer 50. The source line SL is provided above the wire D2. The source line SL is, for example, a plate-shaped conductor extending in the X direction and the Y direction. The word lines 20 and the selection gates 30 and 40 are stacked on the source line SL. The word lines 20 are located between the selection gate 30 and the selection gate 40. The channel layer 50 penetrates the word lines 20, the selection gates 30 and 40, and extends in the Z direction. The lower end of the channel layer 50 is electrically connected to the source line SL. The channel layer 50 may be referred to as semiconductor pillar in some contexts.

As shown in FIG. 1, end portions of the word lines 20, and the selection gates 30 and 40 are provided in a staircase or stair-stepped pattern, and each end portion is connected to an M0 wire via a contact plug C3. The M0 wire is connected to a row decoder in the drive circuit DC via a contact plug, for example.

A memory cell MC is formed at the intersection of a word line 20 and a channel layer 50. An insulating layer 60 is provided between the word line 20 and the channel layer 50. The insulating layer 60 extends in the Z direction along the channel layer 50, and functions as a charge retention layer in a portion located between the word line 20 and the channel layer 50.

A source-side select transistor STS is provided in a portion where the channel layer 50 intersects the selection gate 30. Further, a drain-side select transistor STD is provided in a portion where the channel layer 50 intersects the selection gate 40.

The storage device 1 further includes a contact plug C4 that penetrates the word lines 20, the selection gates 30 and 40, and the source line SL, and extends in the Z direction.

The contact plug C4 is provided, for example, in the central portion of the word lines 20, and its lower end is connected to the wire D2.

The storage device 1 further includes an M1 wire and an M2 wire. The M1 wire is provided above the selection gate 40, and includes, for example, a plurality of bit lines BL. The M2 wire is provided above the M1 wire.

Each of the bit lines BL is electrically connected to a channel layer 50. Further, the bit line BL is connected to the M2 wire in a portion not shown. The M2 wire is electrically connected to the contact plug C4 via the M1 wire. That is, the bit line BL is electrically connected to a sense amplifier provided in the drive circuit DC via the M2 wire and the contact plug C4, for example.

Figure 2:
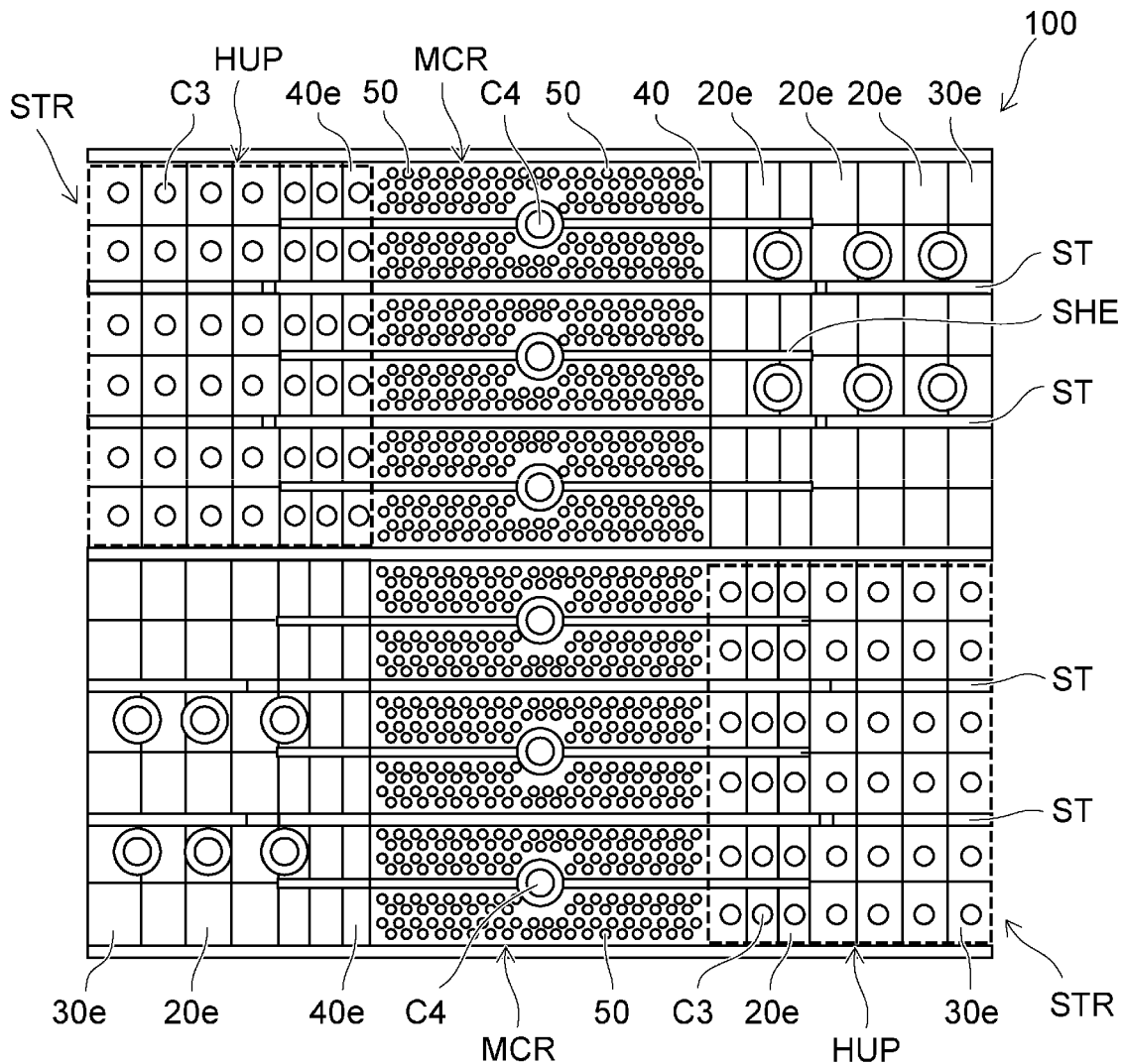
FIG. 2 is a schematic plan view showing the storage device according to an embodiment.

FIG. 2 is a schematic plan view showing the storage device 1. FIG. 2 is a schematic diagram showing the upper surface of a stacked body 100 including the word lines 20 and the selection gates 30 and 40 stacked in the Z direction. The stacked body 100 includes a plurality of portions divided by slits ST. Each of the portions divided by the slits ST includes the word lines 20 and the selection gates 30 and 40 stacked in the Z direction. It is noted that the interior of each slit ST is filled with an insulating layer such as a silicon oxide layer, for example. Further, the source line SL (see FIG. 1) is disposed on the back surface side of the stacked body 100 as a plate-shaped integral conductive layer, for example.

A memory cell region MCR is provided at the center of the stacked body 100. A plurality of channel layers 50 are disposed in the memory cell region MCR. A staircase region STR is provided on both sides of the memory cell region MCR where an end portion 20e of each of the word lines 20 and an end portion 30e of the selection gate 30 are exposed. A lead-out portion HUP is provided in the staircase region STR. A contact plug C3 electrically connected to the end portions 20e, 30e and 40e of the word lines 20, the selection gates 30 and 40 is disposed in the lead-out portion HUP.

In this embodiment, a contact plug C4 is provided in the center of the memory cell region MCR. The contact plug C4 may be disposed so as to intersect a groove SHE that is dividing the selection gate 40. It is noted that the interior of the groove SHE is filled with an insulating layer such as a silicon oxide layer, for example. Furthermore, the contact plug C4 may be disposed in a portion where the lead-out portion HUP in the staircase region STR is not disposed.

Figure 3A:
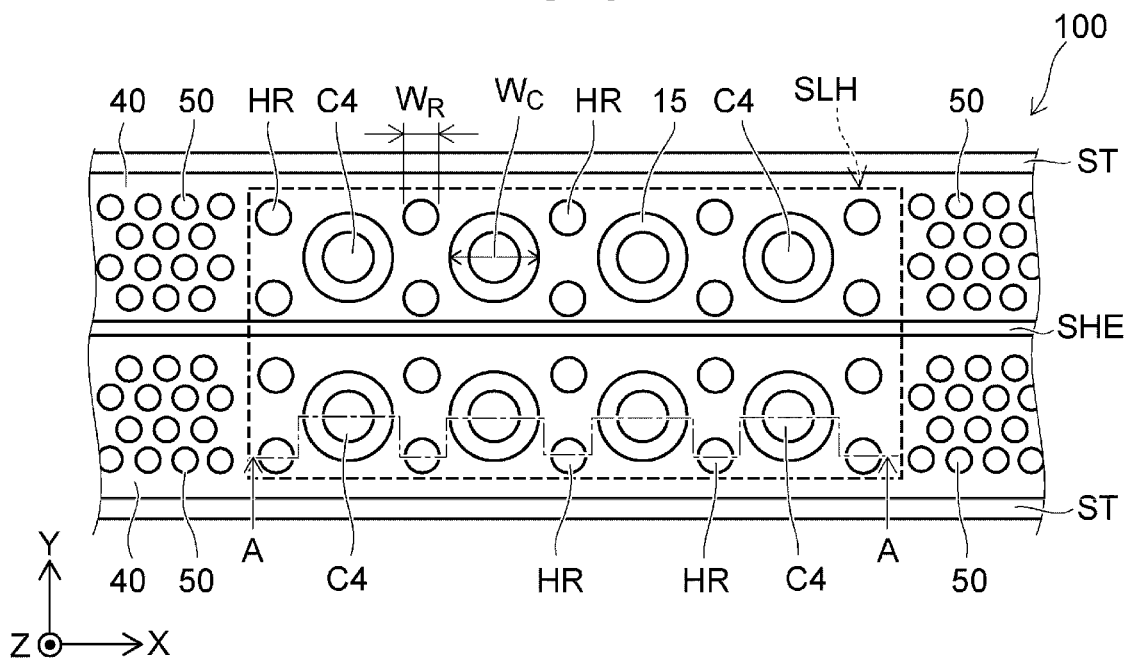
FIGS. 3A and 3B are schematic plan views showing a part of the storage device according to an embodiment.
Figure 3B:
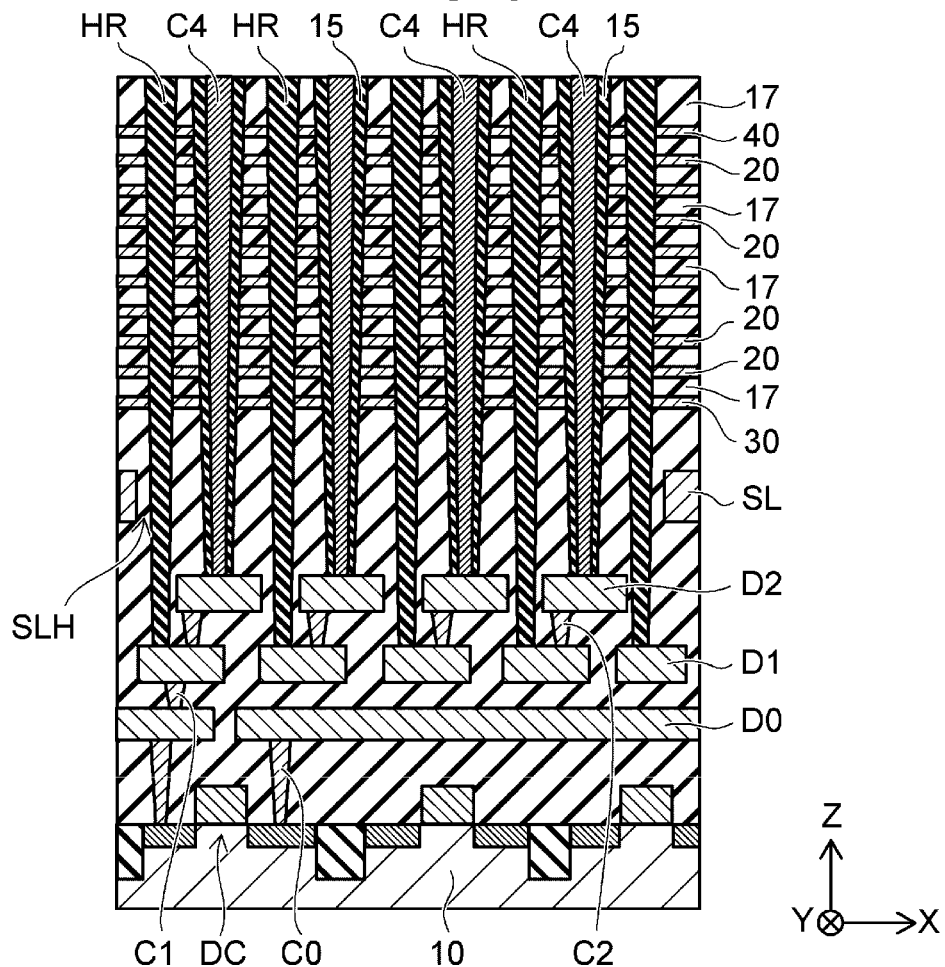

FIGS. 3A and 3B are schematic plan views illustrating a part of the storage device 1. FIG. 3A is a plan view showing a part of the selection gate 40 on the upper surface of the stacked body 100. FIG. 3B is a cross-sectional view taken along the line A-A in FIG. 3A.

In this example, as shown in FIG. 3A, a plurality of contact plugs C4 are disposed in each selection gate 40 divided by the groove SHE. Furthermore, a plurality of columnar support bodies HR are provided around the contact plugs C4. The side surface of each contact plug C4 is surrounded by an insulating layer 15. As a result, the contact plug C4 is electrically insulated from the word lines 20 and the selection gates 30 and 40. Further, in each of the word lines 20 and the selection gate 40, the width $W_C$ in the X-direction or Y-direction of the through-via-hole through which the contact plug C4 penetrates is wider than the width $W_R$ of the through-via-hole through which the columnar support body HR penetrates.

Each contact plug C4 and each columnar support body HR penetrate the selection gate 40, the word lines 20 and the selection gate 30, and further extend downward through a through-via-hole SLH provided in the source line SL. In contrast, each channel layer 50 penetrates the selection gate 40, the word lines 20 and the selection gate 30, and is connected to the source line SL at the lower end thereof.

As shown in FIG. 3B, the stacked body 100 includes interlayer insulating films 17 between the word lines 20, between a word line 20 and the selection gate 30, and between a word line 20 and the selection gate 40, respectively. The contact plug C4 and the columnar support body HR penetrate the word lines 20, the selection gates 30 and 40, and the interlayer insulating films 17, and extend downward. The lower end of the contact plug C4 is connected to the wire D2. In contrast, the lower end of the columnar support body HR is connected to the wire D1. The contact plug C4 is electrically connected to the drive circuit DC via wires D0 to D2 mutually connected by contact plugs C0 to C2, for example.

For example, in the manufacturing process of the stacked body 100, the contact plug C4 and the columnar support body HR are formed inside the through-via-hole penetrating the interlayer insulating films 17 and sacrificial films (not shown) alternately stacked on the source line SL. The source line SL is, for example, a metal layer including tungsten, and the interlayer insulating film and the sacrificial film are dielectric films such as a silicon oxide film and a silicon nitride film. For this reason, it is difficult to form the through-via-hole penetrating the source line SL at the same time as the forming the through-via-hole penetrating the interlayer insulating films 17 and the sacrificial films. Therefore, the through-via-hole SLH is formed in the source line SL beforehand, and the contact plug C4 and the columnar support body HR are formed so as to pass through this through-via-hole SLH.

Further, the wires D2 and D1 are disposed at positions communicated by the through-via-holes respectively provided with the contact plug C4 and the columnar support body HR. As a result, the wires D1 and D2 each function as an etching stop layer. That is, if there is no wire D1 and D2, etching of the through-via-hole cannot be stopped on one of this wire portions (D1 or D), thus, the substrate 10 may be etched inadvertently, and the drive circuit DC provided on the upper surface of the substrate 10 may be deteriorated.

The width in the X direction and the Y direction of the through-via-hole provided with the columnar support body HR is formed to be narrower than the width in the X direction and the Y direction of the through-via-hole provided with the contact plug C4, for example. Thereby, the contact plug C4 and the columnar support body HR can be formed in a common process.

For example, when the insulating layer 15 is formed inside a through-via-hole, the through-via-hole is blocked at a portion where the columnar support body HR is formed, and a cavity is left inside the through-via-hole at a portion where the contact plug C4 is formed. At this time, a columnar support body HR containing the same material as that of the insulating layer 15 is formed inside the blocked through-via-hole. Subsequently, a part of the insulating layer 15 formed on the bottom surface of the through-via-hole in which the contact plug C4 is formed is selectively removed, and a metal such as tungsten is embedded in the cavity. In this way, it is possible to form both the contact plug C4 and the columnar support body HR.

Furthermore, in the process of forming the word lines 20 and selection gates 30 and 40 by replacement of the sacrificial films (located between the interlayer insulating films 17) with a metal layer, the columnar support body HR supports the interlayer insulating films 17 and functions to prevent the spaces formed after the sacrificial film are removed from being blocked off.

Figure 4A:
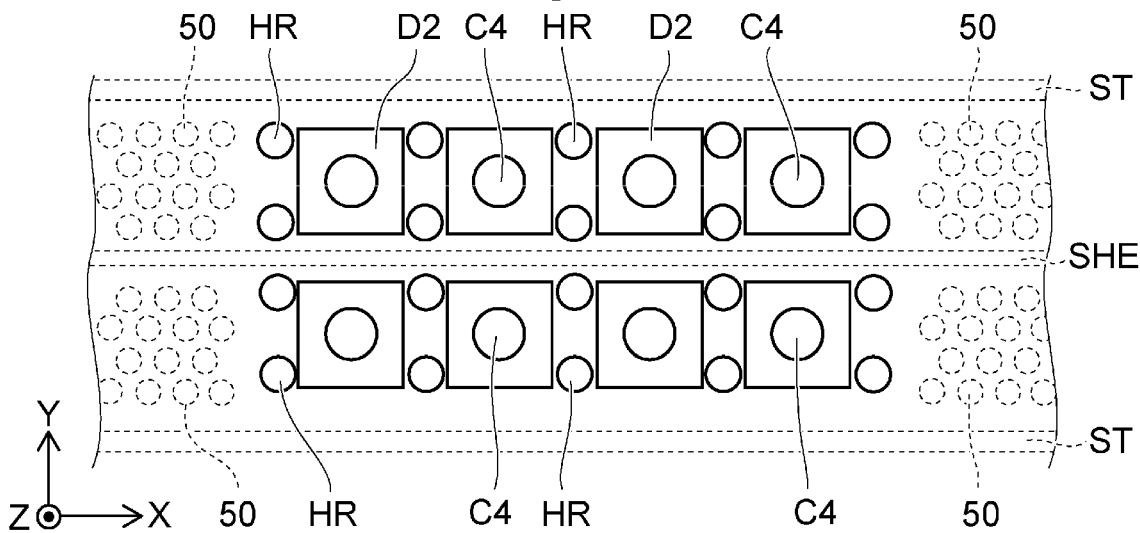
FIGS. 4A, 4B, and 4C are schematic plan views showing wires of the storage device according to an embodiment.
Figure 4B:
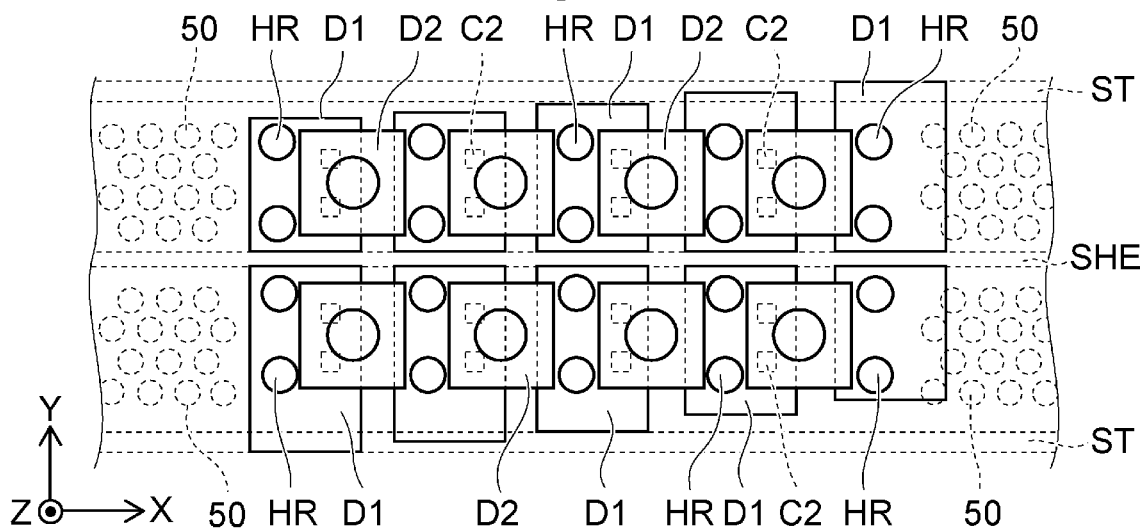
Figure 4C:
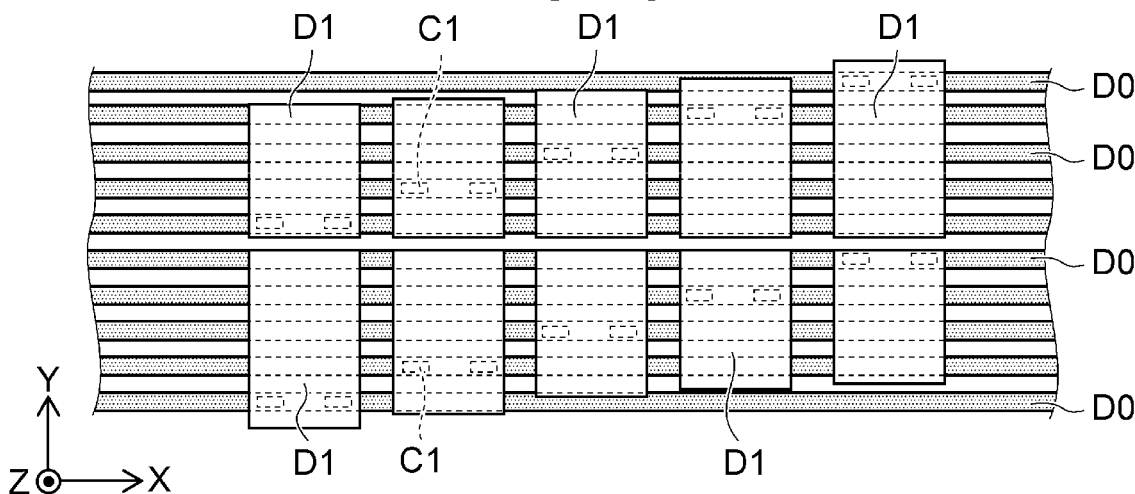

FIGS. 4A to 4C are schematic plan views showing the wires D0, D1 and D2 of the storage device 1 according to the embodiment. FIG. 4A is a plan view showing the wires D2, and FIG. 4B is a plan view showing the wires D1 and D2. FIG. 4C is a plan view showing the wires D0 and D1.

As shown in FIG. 4A, each wire D2 is provided at a position where the contact plug C4 is disposed above the wire D2. The wires D2 are disposed so as to be separated from each other.

As shown in FIG. 4B, each wire D1 is disposed so as to block a space between the adjacent wires D2 in the X direction. Thus, the lower end of the columnar support body HR disposed around the contact plug C4 can be connected to the wire D1. Further, the wire D1 is disposed so as to overlap the wire D2 so that the wire D2 is electrically connected to the wire D1 by the contact plug C2.

As shown in FIG. 4C, the wires D0 extend in the X direction and are disposed in the Y direction. For example, each wire D0 is connected to a circuit element of the drive circuit DC (see FIG. 1) via the contact plug C0. Each wire D1 is disposed above the wires D0 and is electrically connected to one wire D0 via the contact plug C1. That is, a contact plug C4 is connected to a wire D0 via the wires D1 and D2.

Figure 5A:
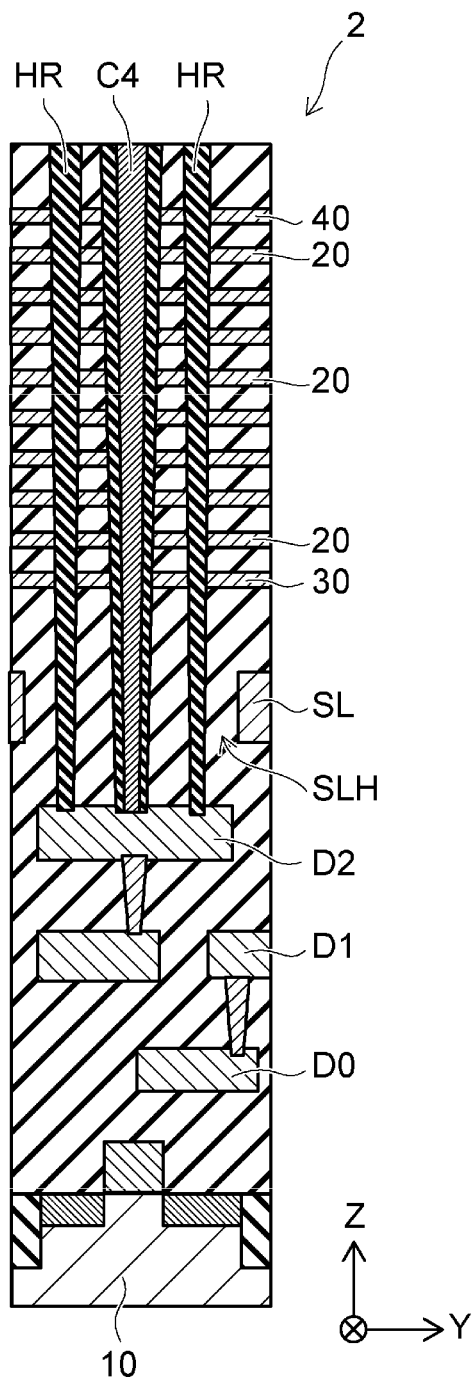
FIGS. 5A and 5B are schematic cross-sectional views showing a storage device according to an embodiment.
Figure 5B:
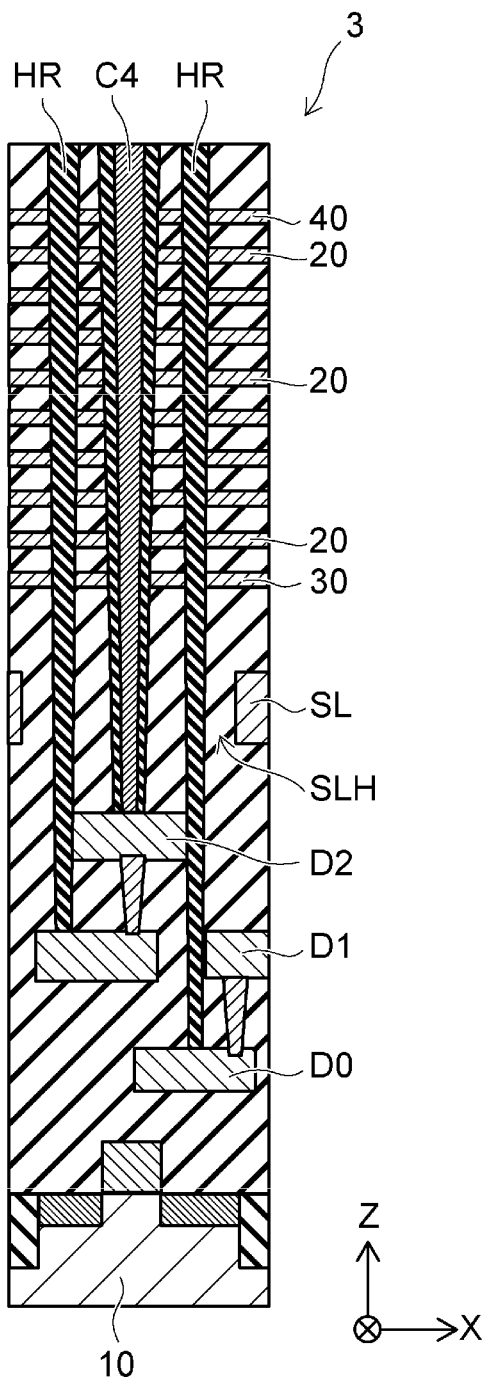

FIGS. 5A and 5B are schematic cross-sectional views showing storage devices 2 and 3 according to an embodiment. In the storage device 2, as shown in FIG. 5A, the contact plug C4 and the columnar support body HR disposed around the contact plug C4 are connected to the common wire D2. Further, in the storage device 3, as shown in FIG. 5B, the contact plug C4 is connected to the wire D2, and the columnar support body HR disposed around the contact plug C4 is connected to the wires D0 and D1.

In this way, the columnar support body HR may be connected to any of the wires, and a wire connecting the columnar support body HR may be selected according to the form of the wiring below the source line SL. It is noted that the above description is of an example, and the disclosure is not limited thereto. For example, the wiring below the source line SL may be a stacked wiring including three or more layers of wiring. Further, the columnar support body HR is not limited to an insulator, and may have the same structure as that of the channel layer 50.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the present disclosure.

What is claimed is:

1. A storage device, comprising:
   a circuit on a substrate;
   a plurality of electrode layers stacked in a stacking direction above the circuit;
   a channel layer penetrating the electrode layers in the stacking direction;
   a first wire between the electrode layers and the circuit, the first wire having a planar shape and being electrically connected to the channel layer;
   a second wire between the circuit and the first wire;
   a third wire between the circuit and the second wire;
   a contact plug penetrating the electrode layers and the first wire in the stacking direction and electrically connected to the second wire; and
   a columnar support body penetrating the electrode layers and the first wire in the stacking direction and having a lower end in contact with one of the second wire or the third wire, wherein
   the first wire has a through-via-hole above the second wire, and
   the contact plug and the columnar support body are inside the through-via-hole.

2. The storage device according to claim 1, wherein the columnar support body comprises an insulator.

3. The storage device according to claim 2, further comprising:
   an insulating layer between the contact plug and the electrode layers, wherein
   the columnar support body and the insulating layer are a same material.

4. The storage device according to claim 1, wherein
   each electrode layer has a first through-via-hole in a portion that intersects the contact plug and a second through-via-hole in a portion that intersects the columnar support body, and
   a width of the first through-via-hole in a direction perpendicular to the stacking direction is wider than a width of the second through-via-hole in the same direction.

5. The storage device according to claim 1, wherein the third wire connects different components of the circuit.

6. The storage device according to claim 1, wherein the columnar support body and the contact plug are a same material.

7. The storage device according to claim 1, further comprising:
   a plurality of a columnar support bodies disposed around the contact plug.

8. The storage device according to claim 1, wherein the lower end of the columnar support body is in contact with the second wire.

9. The storage device according to claim 1, wherein the lower end of the columnar support body is in contact with the third wire.

10. A storage device, comprising:
    a semiconductor substrate having a driving circuit formed thereon;
    a first insulating film on the semiconductor substrate covering the driving circuit;
    a first wire on the first insulating film;
    a second wire in the first insulating film between the first wire and the driving circuit in a first direction;
    a third wire in the first insulating film between the driving circuit and the second wire in the first direction;
    a stacked body over the first wire and comprising second insulating films and electrode films alternately stacked along the first direction;
    a channel layer penetrating the stacked body in the first direction and contacting the first wire;
    a contact plug penetrating the stacked body and the first wire in the stacking direction, electrically connected to the second wire and electrically insulated from the electrode layers and the first wire; and
    a plurality of columnar support bodies penetrating the electrode layers and the first wire in the stacking direction, wherein the contact plug is surrounded by the plurality of columnar support bodies in a region that lacks a channel layer between the contact plug and the plurality of columnar support bodies.

11. The storage device of claim 10, wherein the contact plug passes through a planar center of the stacked body.

12. The storage device of claim 10, wherein each lower end of the plurality of columnar support bodies is in contact with one of the second wire or the third wire.

13. The storage device of claim 10, wherein
the stacked body has a first through-via-hole in a portion that intersects the contact plug and a second through-via-hole in a portion that intersects the columnar support body, and
in the stacked body, a width of the first through-via-hole in a direction perpendicular to the stacking direction is wider than a width of the second through-via-hole in the same direction.

14. The storage device according to claim 10, wherein the third wire connects different components of the driving circuit.

15. The storage device according to claim 10, wherein the columnar support body comprises an insulator.

16. A storage device, comprising:
a semiconductor substrate having a driving circuit formed thereon;
a first insulating film on the semiconductor substrate covering the driving circuit;
a source line layer on the first insulating film;
a first wiring level in the first insulating film between the source line layer and the driving circuit in a first direction;
a stacked memory cell array on the source line layer, the stacked memory cell array comprising a plurality of electrode layers stacked in the first direction, and a plurality of insulating layers between adjacent electrode layers in the first direction, a plurality of semiconductor pillars extending through the plurality of electrode layers in the first direction and contacting the source line layer;
a contact plug penetrating the stacked memory cell array and the source line layer in the stacking direction and electrically connected to a wire on the first wiring level and electrically insulated from the source line layer and the plurality of electrode layers; and
a columnar support body penetrating the stacked memory cell array and the source line layer in the first direction.

17. The storage device according to claim 16, wherein the columnar support body comprises an insulator.

18. The storage device according to claim 16, wherein
the driving circuit is electrically connected to the contact plug via a wire on the first wiring level, and
the driving circuit is below the stacked memory cell array in the first direction.

19. The storage device according to claim 16, further comprising:
a plurality of contact plugs each disposed at a position within the stacked memory cell array.

* * * * *